United States Patent
Lin et al.

(10) Patent No.: US 10,687,419 B2
(45) Date of Patent: Jun. 16, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Ming-Ze Lin, Kaohsiung (TW); Chia Ching Chen, Kaohsiung (TW); Yi Chuan Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/621,964

(22) Filed: Jun. 13, 2017

(65) Prior Publication Data
US 2018/0359853 A1    Dec. 13, 2018

(51) Int. Cl.
H05K 1/02 (2006.01)
H05K 1/09 (2006.01)
H05K 1/11 (2006.01)
H05K 1/18 (2006.01)
H05K 3/36 (2006.01)
H01L 21/00 (2006.01)
H01L 21/48 (2006.01)
H01L 21/50 (2006.01)
(Continued)

(52) U.S. Cl.
CPC ....... H05K 1/0298 (2013.01); H01L 21/4857 (2013.01); H01L 23/145 (2013.01); H01L 23/49822 (2013.01); H05K 1/115 (2013.01); H05K 3/4623 (2013.01); H01L 2224/16225 (2013.01); H05K 2203/1438 (2013.01)

(58) Field of Classification Search
CPC ... H05K 1/11; H05K 1/02; H05K 1/09; H05K 1/18; H05K 3/36; H05K 3/48; H01L 21/00; H01L 21/48; H01L 21/50; H01L 21/56; H01L 21/66; H01L 21/78; H01L 23/00; H01L 23/02; H01L 23/48; H01L 23/49; H01L 23/498; H01L 23/522
USPC ............. 174/261, 252, 255, 258, 262, 264; 257/528, 678, 680, 686, 737, 738, 750, 257/774, 777, 792; 361/764, 748; 29/829, 830; 438/107, 119, 624
See application file for complete search history.

(56) References Cited

U.S. PATENT DOCUMENTS

8,022,555 B2 * 9/2011 Hwang ................. H01L 23/481
257/673
8,143,531 B2 * 3/2012 Miki ................... H01L 21/6835
174/255
(Continued)

Primary Examiner — Xiaoliang Chen
(74) Attorney, Agent, or Firm — Foley & Lardner LLP (57) ABSTRACT

A semiconductor package device includes a first dielectric layer, a first interconnection layer, a second interconnection layer, and a second dielectric layer. The first dielectric layer has a first surface, a second surface opposite to the first surface and a lateral surface extending between the first surface and the second surface. The first interconnection layer is within the first dielectric layer. The second interconnection layer is on the second surface of the first dielectric layer and extends from the second surface of the first dielectric layer into the first dielectric layer to electrically connect to the first interconnection layer. The second dielectric layer covers the second surface and the lateral surface of the first dielectric layer and the second interconnection layer.

17 Claims, 8 Drawing Sheets

(51) Int. Cl.
*H01L 21/56* (2006.01)
*H01L 21/66* (2006.01)
*H01L 21/78* (2006.01)
*H01L 23/00* (2006.01)
*H01L 23/02* (2006.01)
*H01L 23/48* (2006.01)
*H01L 23/49* (2006.01)
*H01L 23/498* (2006.01)
*H01L 23/522* (2006.01)
*H05K 3/46* (2006.01)
*H01L 23/14* (2006.01)

(56) References Cited

U.S. PATENT DOCUMENTS

| | | | |
|---|---|---|---|
| 8,830,689 B2 | 9/2014 | Kim et al. | |
| 9,252,030 B1* | 2/2016 | Jin | H01L 21/563 |
| 9,524,930 B2* | 12/2016 | Gluschenkov | H01L 21/486 |
| 9,693,455 B1* | 6/2017 | Park | H05K 1/112 |
| 9,818,683 B2* | 11/2017 | Chiang | H01L 23/49838 |
| 9,905,551 B2* | 2/2018 | Kim | H01L 25/50 |
| 9,941,054 B2* | 4/2018 | Sankman | H01G 4/33 |
| 2004/0184219 A1* | 9/2004 | Otsuka | H01L 23/49805 361/306.3 |
| 2005/0099193 A1* | 5/2005 | Burgess | G01R 1/0433 324/754.18 |
| 2006/0131176 A1* | 6/2006 | Hsu | C25D 5/022 205/125 |
| 2007/0235850 A1* | 10/2007 | Gerber | H01L 21/4853 257/678 |
| 2007/0281464 A1* | 12/2007 | Hsu | H05K 3/465 438/624 |
| 2008/0121417 A1* | 5/2008 | Fan | H05K 1/162 174/260 |
| 2008/0155820 A1* | 7/2008 | Arai | H01L 21/565 29/830 |
| 2009/0145636 A1* | 6/2009 | Miki | H01L 21/6835 174/255 |
| 2009/0231820 A1* | 9/2009 | Tanaka | H01L 23/49822 361/764 |
| 2010/0081236 A1* | 4/2010 | Yang | H01L 23/147 438/119 |
| 2010/0327435 A1* | 12/2010 | Nakamura | H01L 23/49811 257/737 |
| 2011/0089552 A1* | 4/2011 | Park | H01L 21/568 257/686 |
| 2011/0115082 A1* | 5/2011 | Gluschenkov | H01L 21/486 257/738 |
| 2011/0215478 A1* | 9/2011 | Yamamichi | H01L 23/522 257/773 |
| 2011/0227223 A1* | 9/2011 | Wu | H01L 23/5389 257/738 |
| 2011/0240357 A1* | 10/2011 | Kariya | H01L 23/5389 174/266 |
| 2012/0032331 A1* | 2/2012 | Lee | H01L 23/49822 257/750 |
| 2012/0146209 A1* | 6/2012 | Hu | H01L 23/36 257/692 |
| 2012/0280381 A1* | 11/2012 | Beyne | H01L 23/3128 257/680 |
| 2013/0026632 A1* | 1/2013 | Kikuchi | H01L 21/6835 257/753 |
| 2013/0207260 A1* | 8/2013 | Hsu | H01L 23/48 257/738 |
| 2014/0027925 A1* | 1/2014 | Tseng | H01L 23/481 257/774 |
| 2014/0084413 A1* | 3/2014 | Chen | H01L 23/49822 257/528 |
| 2014/0102772 A1* | 4/2014 | Chen | H05K 1/113 174/255 |
| 2014/0131856 A1* | 5/2014 | Do | H01L 21/56 257/737 |
| 2014/0182906 A1* | 7/2014 | Hu | H01L 23/49827 174/258 |
| 2015/0125993 A1* | 5/2015 | Lee | H01L 25/50 438/107 |
| 2015/0371965 A1* | 12/2015 | Hu | H01L 21/78 257/737 |
| 2016/0088736 A1* | 3/2016 | Sankman | H05K 1/162 361/748 |
| 2016/0091532 A1* | 3/2016 | Song | G01R 1/0735 324/762.03 |
| 2016/0133562 A1* | 5/2016 | Lee | H01L 24/19 257/774 |
| 2016/0205778 A1* | 7/2016 | Lin | H01L 24/97 174/264 |
| 2017/0011993 A1* | 1/2017 | Zhao | H01L 23/49838 |
| 2017/0040248 A1* | 2/2017 | Chiang | H01L 23/49838 |
| 2017/0148716 A9* | 5/2017 | Chiang | H01L 23/49838 |
| 2017/0194249 A1* | 7/2017 | Chen | H01L 23/5226 |
| 2017/0196084 A1* | 7/2017 | Ishihara | H05K 1/115 |
| 2017/0287872 A1* | 10/2017 | Shen | H01L 25/0655 |
| 2017/0358527 A1* | 12/2017 | Lu | H01L 23/49827 |
| 2018/0330221 A1* | 11/2018 | Fischer | B32B 5/22 |
| 2018/0337164 A1* | 11/2018 | Chen | H01L 24/49 |

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including a fan-out structure and a method of manufacturing the same.

2. Description of the Related Art

With evolving semiconductor technologies, semiconductor chips and/or dies are becoming increasingly smaller. In the meantime, more circuits of various functions are to be integrated into the semiconductor dies. Accordingly, the semiconductor dies tend to have increasing numbers of input/output (I/O) pads packed into smaller areas, and the densities of the I/O pads rise quickly with time. As a result, the packaging of the semiconductor dies becomes more difficult, which adversely affects the yield of the packaging.

SUMMARY

In one or more embodiments, a semiconductor package device includes a first dielectric layer, a first interconnection layer, a second interconnection layer, and a second dielectric layer. The first dielectric layer has a first surface, a second surface opposite to the first surface and a lateral surface extending between the first surface and the second surface. The first interconnection layer is within the first dielectric layer. The second interconnection layer is on the second surface of the first dielectric layer and extends from the second surface of the first dielectric layer into the first dielectric layer to electrically connect to the first interconnection layer. The second dielectric layer covers the second surface and the lateral surface of the first dielectric layer and the second interconnection layer.

In one or more embodiments, a semiconductor package device includes a first dielectric layer, a first interconnection layer, and a seed layer. The first dielectric layer has a first surface, a second surface opposite to the first surface and a lateral surface extending between the first surface and the second surface. The first interconnection layer is within the first dielectric layer. The first interconnection layer has a first surface, wherein a portion of the first surface of the first interconnection layer is exposed from the first dielectric layer. The seed layer contacts the exposed portion of the first surface of the first interconnection layer. The second dielectric layer covers the second surface and the lateral surface of the first dielectric layer.

In one or more embodiments, a method of manufacturing a semiconductor package device includes providing a first interconnection layer embedded in a first dielectric layer, the first dielectric layer having a first surface, a second surface opposite to the first surface and a lateral surface extending between the first surface and the second surface; disposing a second interconnection layer on the first surface of the first dielectric layer, and electrically connecting the second interconnection layer to the first interconnection layer; and disposing a second dielectric layer to cover the first surface and the lateral surface of the first dielectric layer and the second interconnection layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
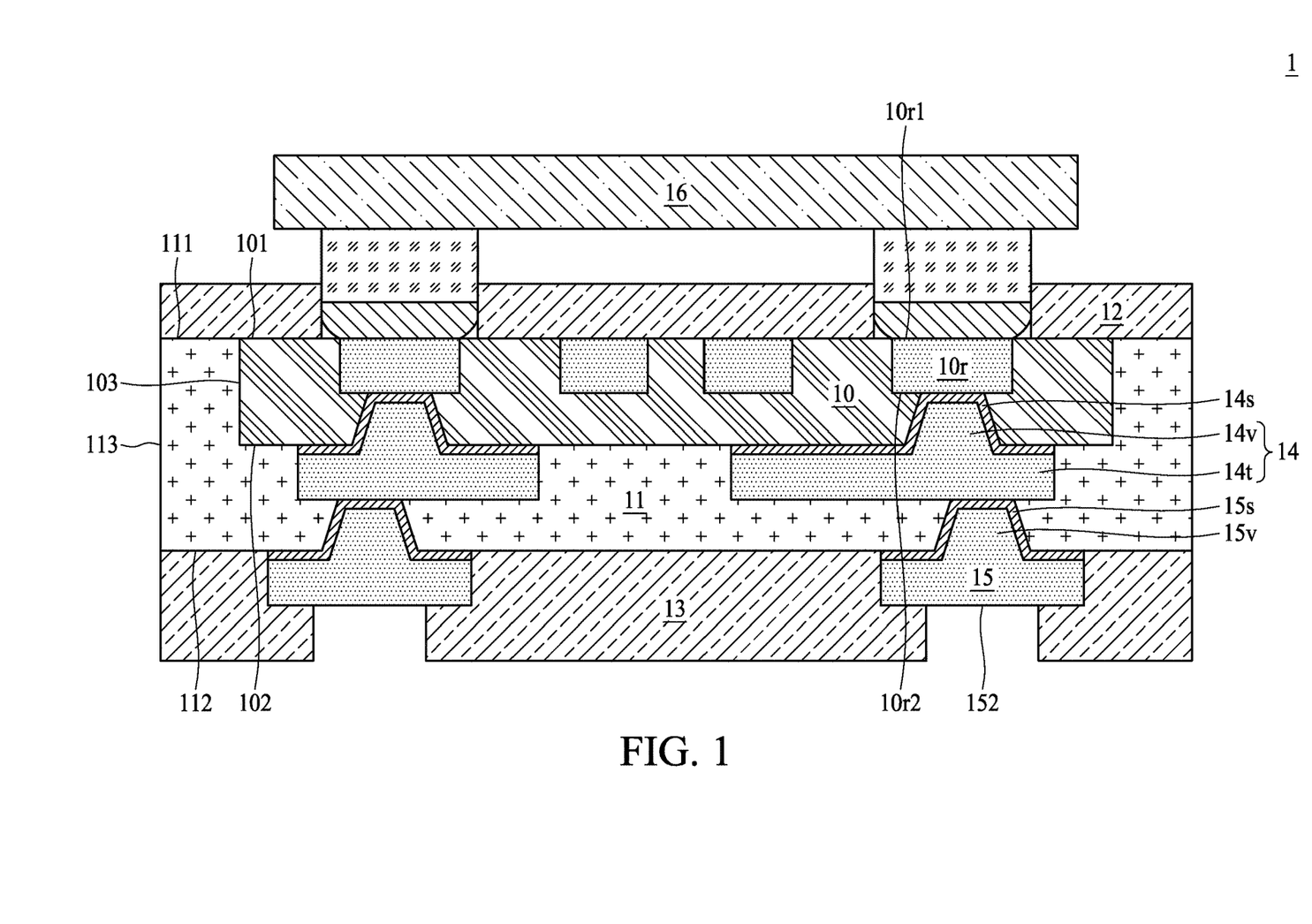
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes dielectric layers 10, 11, protective layers 12, 13, interconnection layers 10r, 14, one or more conductive pads 15 and an electronic component 16.

The dielectric layer 10 has a top surface 101, a bottom surface 102 and a lateral surface 103 extending between the top surface 101 and the bottom surface 102. In some embodiments, the top surface 101 may be referred to as a first surface and the bottom surface 102 may be referred to as a second surface. In some embodiments, the dielectric layer 10 may include, but is not limited to, an epoxy resin including fillers, a molding compound (e.g., an epoxy molding compound or other molding compound), a polyimide, a phenolic compound or material, a material including a silicone dispersed therein, or a combination thereof.

The interconnection layer 10r is disposed or included within the dielectric layer 10. In some embodiments, the interconnection layer 10r is a redistribution layer (RDL). A portion of the interconnection layer 10r is encapsulated or covered by the dielectric layer 10. The interconnection layer 10r has a first surface 10r1 exposed from the top surface 101 of the dielectric layer 10 and a second surface 10r2 opposite to the first surface 10r1. In some embodiments, the interconnection layer 10r includes conductive or electrical traces, and the line width and line space (L/S) of the electrical traces of the interconnection layer 10r is less than about 7 micrometers (μm)/7 μm. For example, the L/S of the interconnection layer 10r is about 2 μm/2 μm or about 3 μm/3 μm.

The dielectric layer 11 covers the bottom surface 102 and the lateral surface 103 of the dielectric layer 10. The dielectric layer 11 has a top surface 111, a bottom surface 112 and a lateral surface 113 extending between the top surface 111 and the bottom surface 112. In some embodiments, the top surface 111 may be referred to as a first surface and the bottom surface 112 may be referred to as a second surface. In some embodiments, the dielectric layer 11 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or another dielectric material of the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials or sheets. In some embodiments, a material of the dielectric layer 10 and a material of the dielectric layer 11 are different.

The interconnection layer 14 is disposed or included within the dielectric layer 11. The interconnection layer 14 includes a first portion 14t (e.g., conductive or electrical traces) disposed on the bottom surface 102 of the dielectric layer 10 and a second portion 14v (e.g., via) extending from the bottom surface 102 of the dielectric layer 10 into the dielectric layer 10. The second portion 14v of the interconnection layer 14 electrically connects to the second surface 10r2 of the interconnection layer 10r. In some embodiments, there is a seed layer 14s between the second surface 10r2 of the interconnection layer 10r and the second portion 14v of the interconnection layer 14. In some embodiments, the seed layer 14s is further between the interconnection layer 14 and the dielectric layer 10. In some embodiments, the L/S of the interconnection layer 14 is greater than about 7 µm/7 µm. In some embodiments, an exposed portion of the interconnection layer 10r, the top surface 101 of the dielectric layer 10 and the top surface 111 of the dielectric layer 11 are substantially coplanar.

The conductive pad 15 is disposed on the bottom surface 112 of the dielectric layer 11 and electrically connected to the interconnection layer 14 through a conductive via 15v. In some embodiments, a seed layer 15s is between the conductive via 15v and the interconnection layer 14. In some embodiments, the seed layer 15s is further between the conductive via 15v and the dielectric layer 11 or the conductive pad 15 and the dielectric layer 11.

The protective layer 13 is disposed on the bottom surface 112 of the dielectric layer 11 to cover a portion of the conductive pad 15. A portion of a surface 152 of the conductive pad 15 is exposed from the protective layer 13 to provide electrical connections. In some embodiments, the protective layer 13 is a solder resist or a solder mask.

The protective layer 12 is disposed on the top surface 101 of the dielectric layer 10 and the top surface 111 of the dielectric layer 11 to cover a portion of the interconnection layer 10r. A portion of the first surface 10r1 of the interconnection layer 10r is exposed from the protective layer 12 to provide electrical connections. In some embodiments, the protective layer 12 is a solder resist or a solder mask.

The electronic component 16 is disposed on the protective layer 12 and electrically connected to the first surface 10r1 of the interconnection layer 10r that is exposed from the protective layer 12. The electronic component 16 may include a semiconductor substrate, one or more integrated circuit devices and one or more overlying interconnection structures therein. The integrated circuit devices may include active devices, such as transistors, and/or passive devices, such as resistors, capacitors, inductors, or a combination thereof.

In a comparable three-dimensional semiconductor package device, one or more semiconductor devices may be attached to a substrate (e.g., BGA substrate or other suitable substrates) by way of an interposer having a fine-pitch (e.g., with L/S of about 2 µm/2 µm or about 3 µm/3 µm) redistribution structure. However, the cost for manufacturing the interposer having fine-pitch structure is relatively expensive. As shown in FIG. 1 of the present disclosure, the interposer is replaced by a fine-pitch interconnection layer 10r (with L/S of about 2 µm/2 µm or about 3 µm/3 µm), which would reduce the manufacturing cost.

FIGS. 2A, 2B, 2C, 2D, 2E, 2F and 2G are cross-sectional views of a semiconductor structure fabricated at various stages, in accordance with some embodiments of the present disclosure. Various figures have been simplified for a better understanding of the aspects of the present disclosure.

Figure 2A:
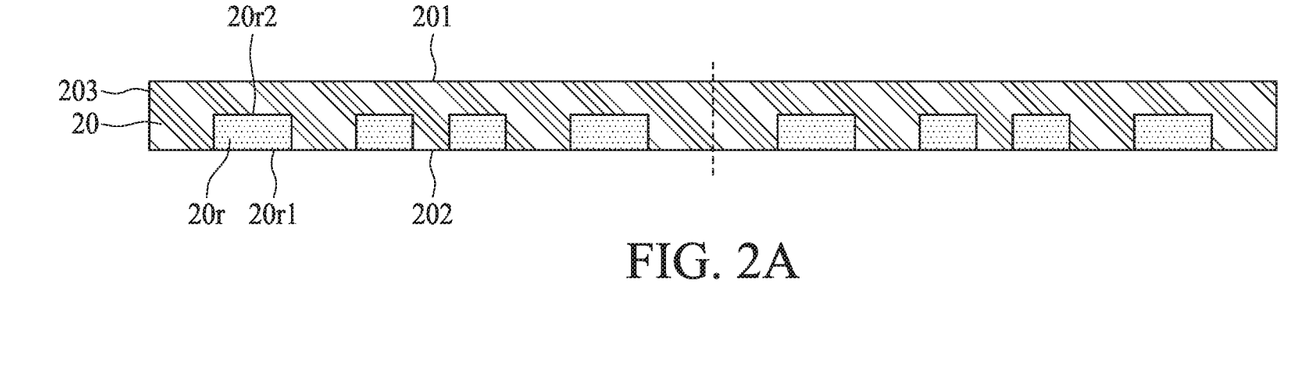
FIG. 2A, FIG. 2B, FIG. 2C, FIG. 2D, FIG. 2E, FIG. 2F and FIG. 2G illustrate a method of manufacturing a semiconductor package device in accordance with some embodiments of the present disclosure.

Referring to FIG. 2A, a substrate strip (e.g., a wafer) including a substrate 20 is provided. The substrate strip has a first surface 201, a second surface 202 opposite to the first surface 201 and a lateral surface 203 extending between the first surface 201 and the second surface 202. In some embodiments, the substrate 20 may include, but is not limited to, an epoxy resin including fillers, a molding compound (e.g., an epoxy molding compound or other molding compound), a polyimide, a phenolic compound or material, a material including a silicone dispersed therein, or a combination thereof.

The substrate 20 includes an interconnection layer 20r. In some embodiments, the interconnection layer 20r is an RDL. The interconnection layer 20r has a first surface 20r1 exposed from the second surface 202 of the substrate 20 and a second surface 20r2 encapsulated by the substrate 20. In some embodiments, the L/S of the interconnection layer 20r is less than about 7 µm/7 µm. For example, the L/S of the interconnection layer 20r is about 2 µm/2 µm or about 3 µm/3 µm.

Figure 2B:
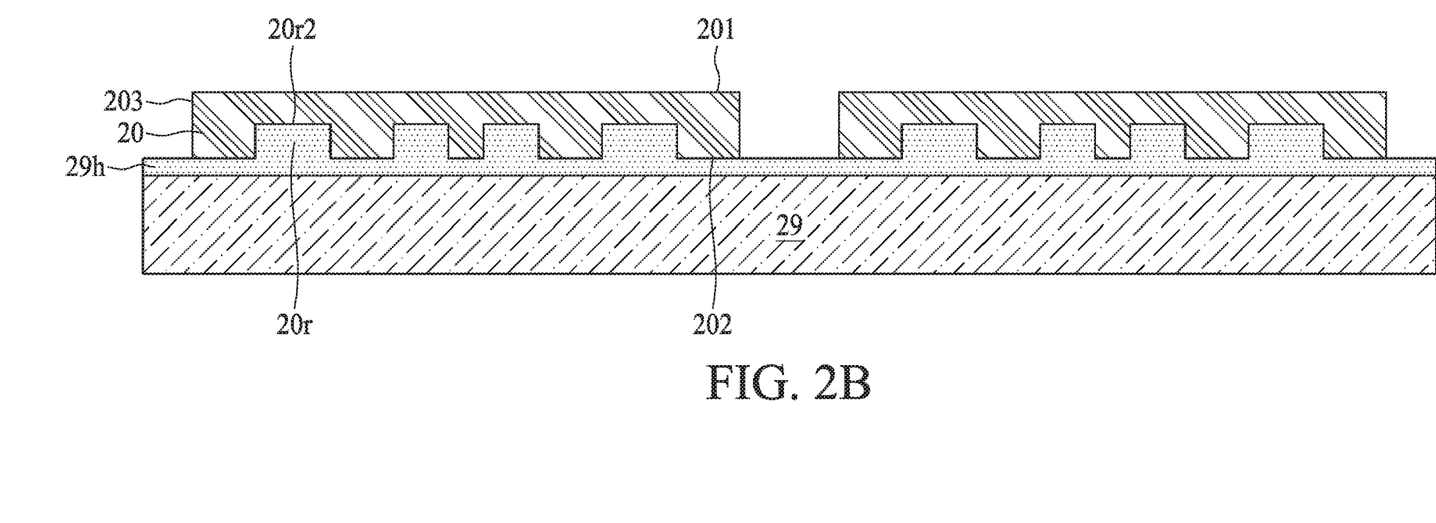

Referring to FIG. 2B, a singulation process may be performed to separate out individual substrates 20. For example, the singulation process is performed through the substrate strip including the substrate 20. The singulation process may be carried out, for example, by using a dicing saw, laser or other suitable cutting technique.

The individual substrates 20 are placed on a carrier 29 and separated from each other. In some embodiments, the individual substrates 20 may be attached to the carrier 29 through an adhesive 29h (e.g., a tape) to facilitate the subsequent processes.

Figure 2C:
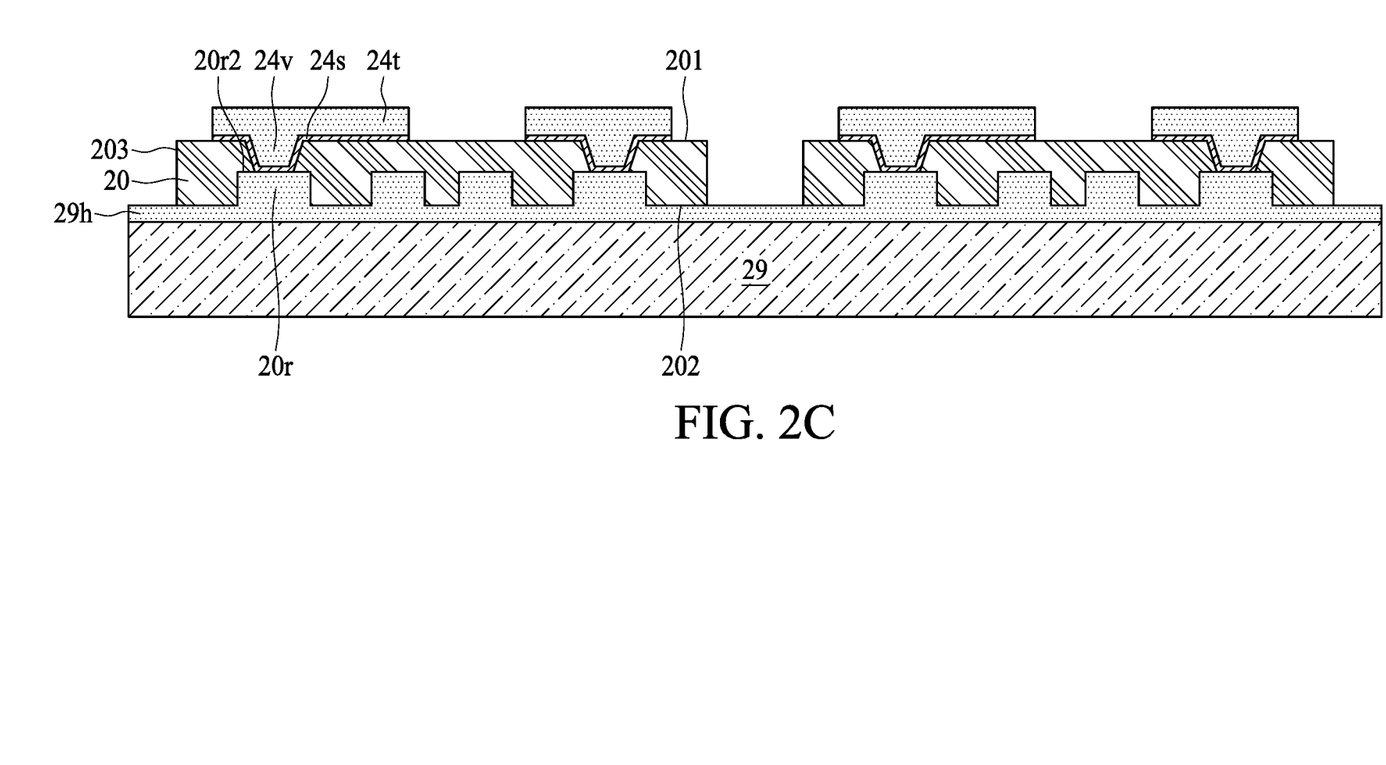

Referring to FIG. 2C, a plurality of openings are formed from the first surface 201 of the substrate 20 into the substrate 20 to expose the second surface 20r2 of the interconnection layer 20r. In some embodiments, the openings are formed by routing, etching, laser or other suitable processes.

A seed layer 24s is formed or disposed on the first surface 201 of the substrate 20 and within the openings to contact the exposed portion of the second surface 20r2 of the interconnection layer 20r. A plurality of conductive vias 24v (which are a portion of an interconnection layer) are formed or disposed within the openings and on the seed layer 24s. Electrical traces 24t (which are another portion of the interconnection layer) are then formed or disposed on the first surface 201 of the substrate 20 and electrically connected to the conductive vias 24v. In some embodiments, the L/S of the electrical traces 24t is greater than about 7 µm/7 µm.

Figure 2D:
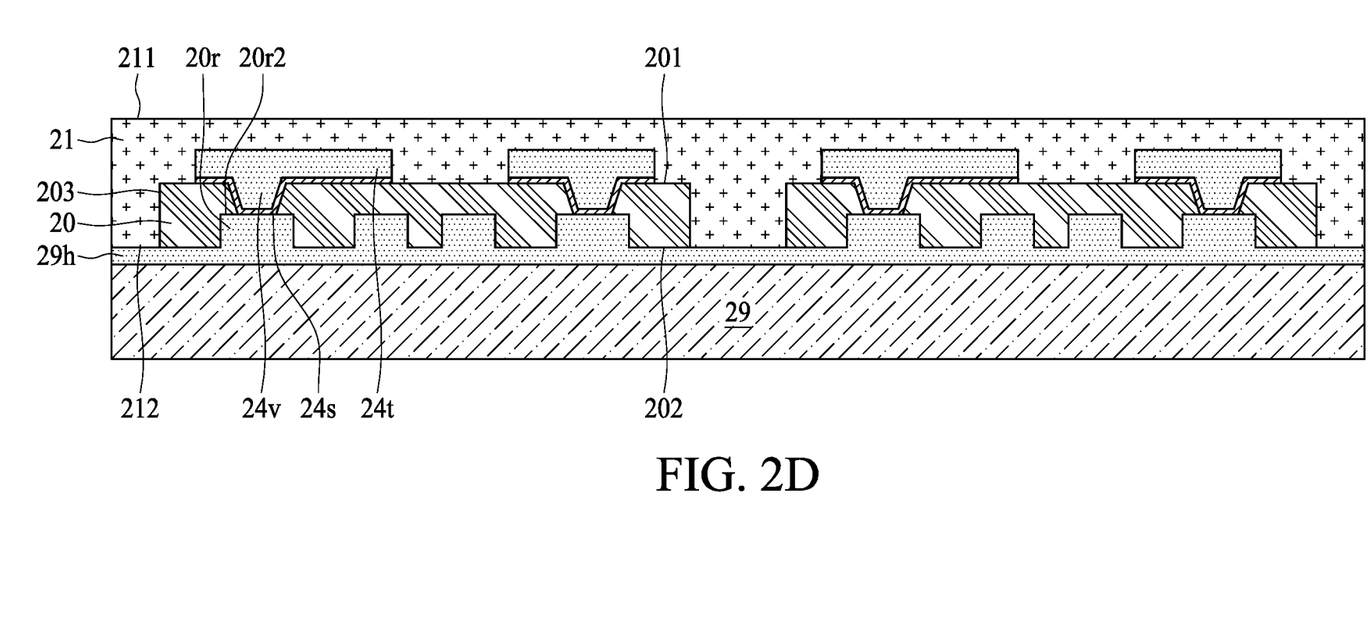

Referring to FIG. 2D, a dielectric layer 21 is formed or disposed on the carrier 29 to cover or encapsulate the substrate 20 and the electrical traces 24t. The dielectric layer 21 has a first surface 211 and a second surface 212 opposite to the first surface 211. In some embodiments, the dielectric layer 21 may include molding compounds, pre-impregnated composite fibers (e.g., pre-preg), BPSG, silicon oxide, silicon nitride, silicon oxynitride, USG, any combination thereof, or another dielectric material of the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials or sheets.

Figure 2E:
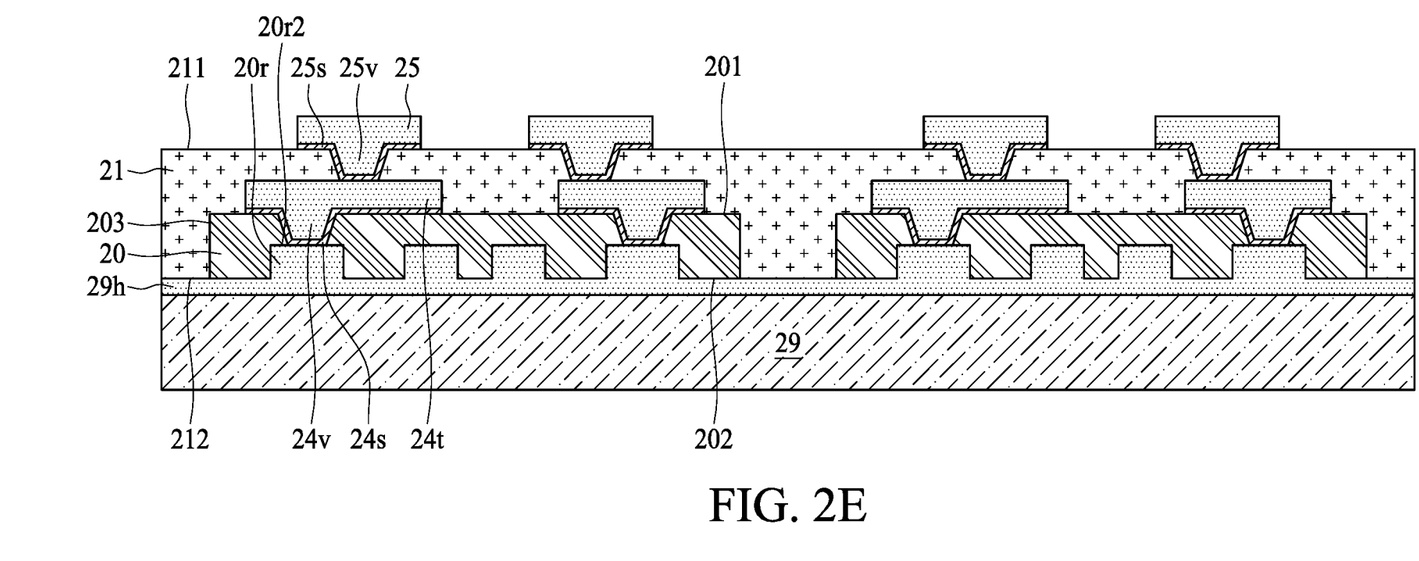

Referring to FIG. 2E, a plurality of openings are formed from the first surface 211 of the dielectric layer 21 into the dielectric layer 21 to expose the electrical traces 24t of the interconnection layer. In some embodiments, the openings are formed by routing, etching, laser or other suitable processes.

A seed layer 25s is formed or disposed on the first surface 211 of the dielectric layer 21 and within the openings to contact the exposed portion of the electrical traces 24t. A plurality of conductive vias 25v are formed or disposed within the openings and on the seed layer 25s. Conductive pads 25 are then formed or disposed on the first surface 211 of the dielectric layer 21 and electrically connected to the conductive vias 25v.

Figure 2F:
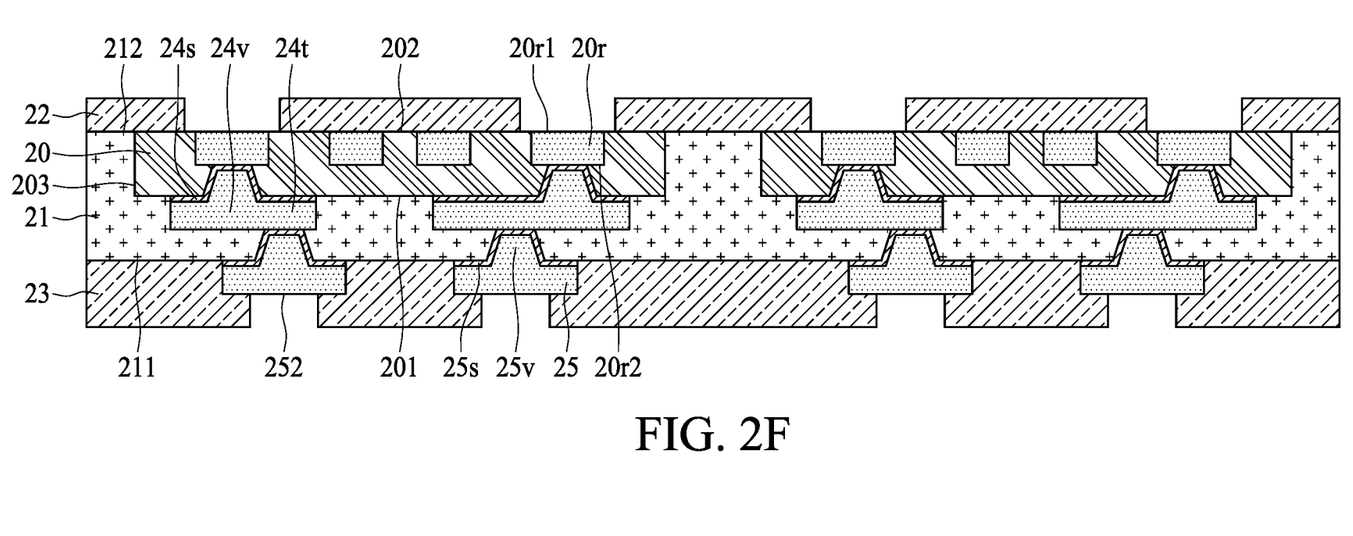

Referring to FIG. 2F, the carrier 29 is removed from the substrate 20 and the dielectric layer 21 to expose the first surface 20r1 of the interconnection layer 20r, the second surface 202 of the substrate 20 and the second surface 212 of the dielectric layer 21.

A protective layer 22 is formed or disposed on the second surface 202 of the substrate 20 and the second surface 212 of the dielectric layer 21. The first surface 20r1 of the interconnection layer 20r is exposed from the protective layer 22. In some embodiments, the protective layer 22 is a solder resist or a solder mask.

A protective layer 23 is formed or disposed on the first surface 211 of the dielectric layer 21 to cover a portion of the conductive pad 25. A portion of a surface 252 of the conductive pad 25 is exposed from the protective layer 23. In some embodiments, the protective layer 23 is a solder resist or a solder mask.

Figure 2G:
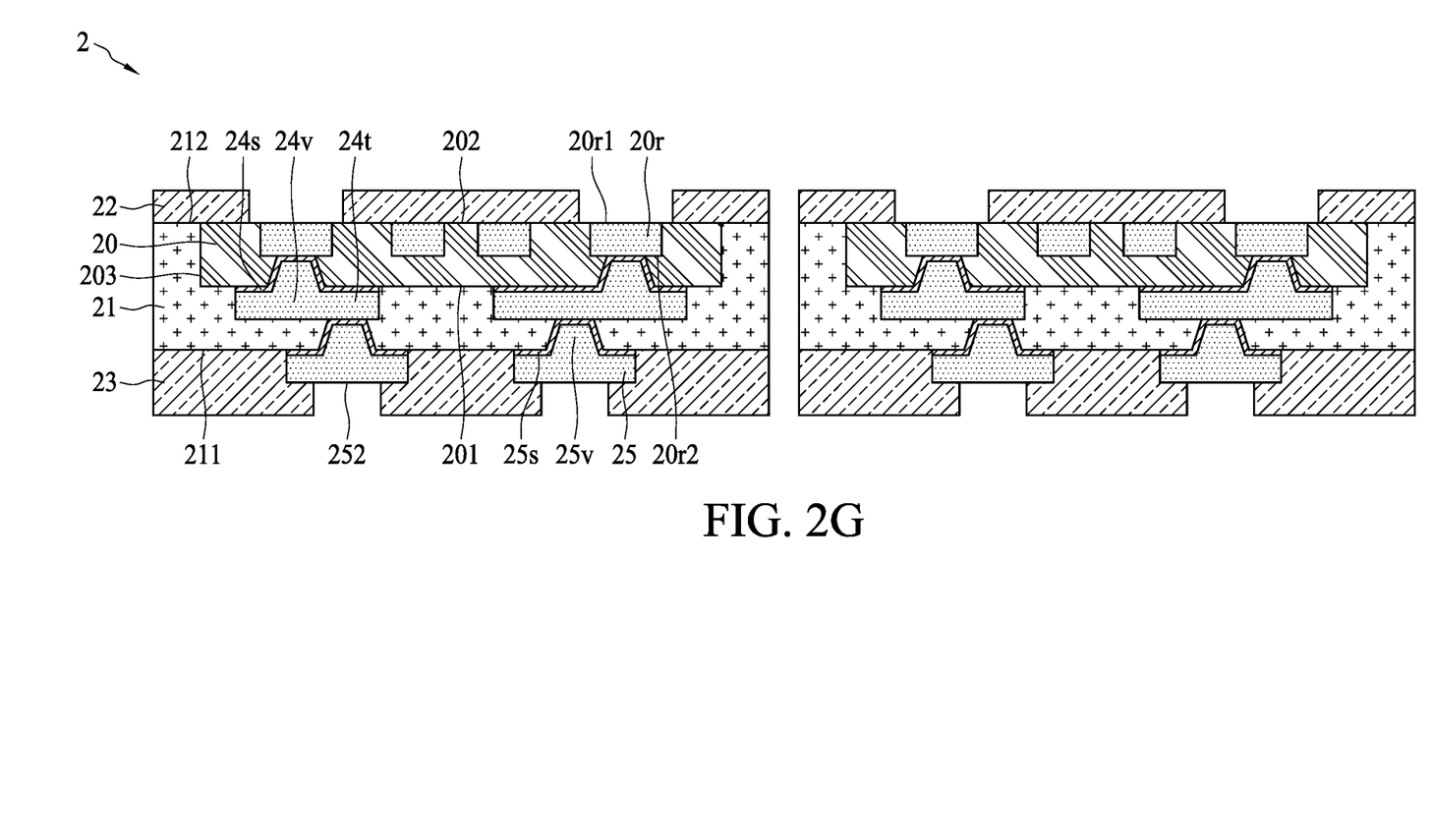

Referring to FIG. 2G, a singulation process may be performed to separate out individual semiconductor package devices 2. For example, the singulation process is performed through the protective layer 22, the dielectric layer 21 and the protective layer 23. The singulation process may be carried out, for example, by using a dicing saw, laser or other suitable cutting technique. In some embodiments, the semiconductor package device 2 is a fan-out structure.

In some embodiments, a die or a chip may be placed on the protective layer 22 and electrically connected to the exposed portion of the first surface 20r1 of the interconnection layer 20r to form the semiconductor package device 1 as shown in FIG. 1.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
a first dielectric layer having a first surface, a second surface opposite to the first surface and a lateral surface extending between the first surface and the second surface;
a first interconnection layer within the first dielectric layer, the first interconnection layer comprising a redistribution layer (RDL);
a second interconnection layer on the second surface of the first dielectric layer and extending from the second surface of the first dielectric layer into the first dielectric layer to electrically connect to the first interconnection layer, wherein the second interconnection layer is in contact with the first interconnection layer;
a second dielectric layer covering the second surface and the lateral surface of the first dielectric layer and the second interconnection layer;
a conductive pad disposed on a bottom surface of the second dielectric layer and extending into the second dielectric layer to electrically connect to the second interconnection layer;
a first seed layer disposed between the first interconnection layer and the second interconnection layer; and
a second seed layer disposed between the second interconnection layer and the conductive pad,
wherein the first interconnection layer has a surface coplanar with the first surface of the first dielectric layer;
wherein the second interconnection layer includes a first portion and the second portion connected the first portion, the first portion is surrounded by the first dielectric layer and the second portion is surrounded by the second dielectric layer; and
wherein the first seed layer is surrounded by the first dielectric layer and the second dielectric layer.

2. The semiconductor package device of claim 1, wherein the second interconnection layer comprises a conductive trace on the second surface of the first dielectric layer and a via extending from the conductive trace into the first dielectric layer to electrically connect to the first interconnection layer.

3. The semiconductor package device of claim 1, wherein the first seed layer is between the first dielectric layer and the second interconnection layer.

4. The semiconductor package device of claim 1, wherein a portion of the first interconnection layer is exposed from the first surface of the first dielectric layer.

5. The semiconductor package device of claim 4, wherein the exposed portion of the first interconnection layer, the first surface of the first dielectric layer and a top surface of the second dielectric layer are substantially coplanar.

6. The semiconductor package device of claim 5, further comprising a first solder resist disposed on the first surface of the first dielectric layer and the top surface of the second dielectric layer and exposing a portion of the first interconnection layer.

7. The semiconductor package device of claim 1, wherein a material of the first dielectric layer and a material of the second dielectric layer are different.

8. The semiconductor package device of claim 1, wherein the first dielectric layer comprises polyimide.

9. The semiconductor package device of claim 1, wherein the second dielectric layer comprises a composite including dispersed fibers.

10. The semiconductor package device of claim 1, wherein the first interconnection layer comprises a plurality of conductive traces, the second interconnection layer comprises a plurality of conductive traces and wherein a pitch of the conductive traces of the first interconnection layer is less than a pitch of the conductive traces of the second interconnection layer.

11. The semiconductor package device of claim 3, wherein the first seed layer directly contacts the first dielectric layer and the second interconnection layer.

12. The semiconductor package device of claim 4, further comprising an electronic component disposed on the first surface of the first dielectric layer and electrically connected to the exposed portion of the first interconnection layer.

13. The semiconductor package device of claim 1, wherein the second seed layer is disposed between the conductive pad and the bottom surface of the second dielectric layer.

14. The semiconductor package device of claim 13, wherein the second seed layer directly contacts the conductive pad and the bottom surface of the second dielectric layer.

15. The semiconductor package device of claim 1, wherein the second seed layer directly contacts the conductive pad and the second interconnection layer.

16. The semiconductor package device of claim 1, wherein the second dielectric layer covers a portion of the conductive pad.

17. The semiconductor package device of claim 1, wherein a line width and line space (L/S) of the first interconnection layer is less than or equal to about 7 micrometers (μm)/7 μm.

* * * * *